(12) United States Patent
Chuang

(10) Patent No.: US 8,369,101 B2
(45) Date of Patent: Feb. 5, 2013

(54) PCI-E MODULE

(76) Inventor: Yi-Fang Chuang, Sanchong (TW)

(*) Notice: Subject to any disclaimer, the term of this patent is extended or adjusted under 35 U.S.C. 154(b) by 352 days.

(21) Appl. No.: 12/848,296

(22) Filed: Aug. 2, 2010

(65) Prior Publication Data
US 2012/0026709 A1 Feb. 2, 2012

(51) Int. Cl.
*H05K 1/11* (2006.01)
*H05K 1/14* (2006.01)

(52) U.S. Cl. ......... 361/803; 361/752; 361/807; 361/810

(58) Field of Classification Search ............ 439/79, 439/76.1, 80, 934; 361/752–753, 807–810
See application file for complete search history.

(56) References Cited

U.S. PATENT DOCUMENTS 6,881,096 B2* 4/2005 Brown et al. ............ 439/620.01
7,556,528 B1* 7/2009 Ju .............................. 439/541.5

* cited by examiner

*Primary Examiner* — Tuan T Dinh
(74) *Attorney, Agent, or Firm* — Chun-Ming Shih; HDLS IPR Services

(57) ABSTRACT

A PCI-E module includes a circuit board, an insulated housing and a plurality of connection terminals. Each connection terminal has a connection end and a welding end away from the connection end. The connection terminals are alternately and parallelly arranged in the housing to form a structure of the PCI-E module. The circuit board has a plurality of gold fingers on both sides of one end thereof, and each connection end of the connection terminals is electronically connected to the gold fingers. Each welding end of the connection terminals is bent down through and extends out of the housing. Therefore, the PCI-E module can be welded directly on a main board of a computer through the welding ends of the connection terminals.

14 Claims, 9 Drawing Sheets

PCI-E MODULE

BACKGROUND OF THE INVENTION

1. Field of the Invention

The present invention relates to a PCI-E interface, and in particular to a PCI-E module.

2. Description of Prior Art

Since the development of the computer, the computer now has essential internal hardware devices such as main board, memory and Central Process Unit (CPU). Furthermore, a plurality of external hardware devices such as monitor, speaker, cable line and etc, are quickly developed for user's desire.

However, user can only use the plurality of external hardware devices while those devices are connected to the computer. Therefore, the structure of connection between the external hardware devices and the main board of the computer is an important issue for computer developers.

Since the 1990s, the Intel corporation starts to develop Peripheral Component Interconnect (PCI) interface. Intel hopes they can unify the different interfaces of the plurality of external hardware devices for conveniently connecting those external hardware devices to the main board of the computer.

Intel even develops Peripheral Component Interconnect Express (PCI-E) interface in 2004. PCI-E quickly replaces almost every internal buses on the main board of the computer because of the characters of PCI-E. For example, PCI-E is structured based on a faster serial communication system, has a faster transmit rate and PCI-E is capable of plug and play (PnP).

As mentioned above, almost every external hardware device uses the PCI-E interface to connect with the main board of the computer gradually.

FIG. 1 is a schematic view showing connection of PCI-E interface card of Prior Art. The present main board 1 now almost provides bus slots 11 applied PCI or PCI-E interface to be plugged with an interface card 12 which applied PCI or PCI-E interface gold fingers, for example, display card, sound card, network card and etc.

A port 121 of the interface card 12 extends out over the back of a case 10 of the computer. The port 121 is capable of connecting external devices.

However, for satisfying the specification and the bus shape of PCI-E, those interface cards 12 should be manufactured as plate shape for plugging to the bus slot 11 complied with PCI-E interface. Therefore, those interface cards 12 will occupy certain space on the case 10, and cause inconvenient for other devices of wired connection.

Even if the interface cards 12 is installed in a laptop computer without the need of replacement, the interface cards 12 should be still manufactured as plate shape for plugging to the bus slot 11 complied with PCI-E interface in the laptop computer.

The interface cards 12 not only occupy the limited internal space of the laptop computer to cause the difficulty of heat sinking, but also cause the inconvenient of the manufacturing process of the laptop computer.

SUMMARY OF THE INVENTION

The present invention is to provide a PCI-E module, wherein the PCI-E module is integrated by interface card of external device and PCI-E bus. The PCI-E module can be directly welded onto a main board of a computer.

According to the present invention, the PCI-E module includes a circuit board, an insulated housing and a plurality of connection terminals. Each connection terminal has a connection end and a welding end away from the connection end. The connection terminals are alternately and parallelly arranged in the housing to form a structure of the PCI-E module. The circuit board has a plurality of gold fingers on both sides of one end thereof, and each connection end of the connection terminals is electronically connected to the gold fingers. Each welding end of the connection terminals is bent down through and extends out of the housing.

In comparison with prior art, the present invention has advantageous features as follow. With the PCI-E module, the main board of the computer needs not to arrange the PCI-E bus slot for plugging with the interface card of external devices. The interface card of external devices and the PCI-E bus slot will be integrated as the PCI-E module when producing. Therefore, we need not to plug the interface card to the PCI-E bus slot on the main board of the computer, or to connect the interface card with the PCI-E bus slot through a cable line.

Now we can weld the PCI-E module on the main board of the computer directly, and connect external devices to the PCI-E module. It has advantage that the PCI-E module can be directly arrange on the main board of the computer when the computer is produced, and it also saves the certain space of the main board of the computer.

DETAILED DESCRIPTION OF THE INVENTION

The preferred embodiments of the present invention will be described in more detail with reference to the accompanying drawings. The drawings are provided for illustrating only, not intended for limiting the present invention.

Figure 1:
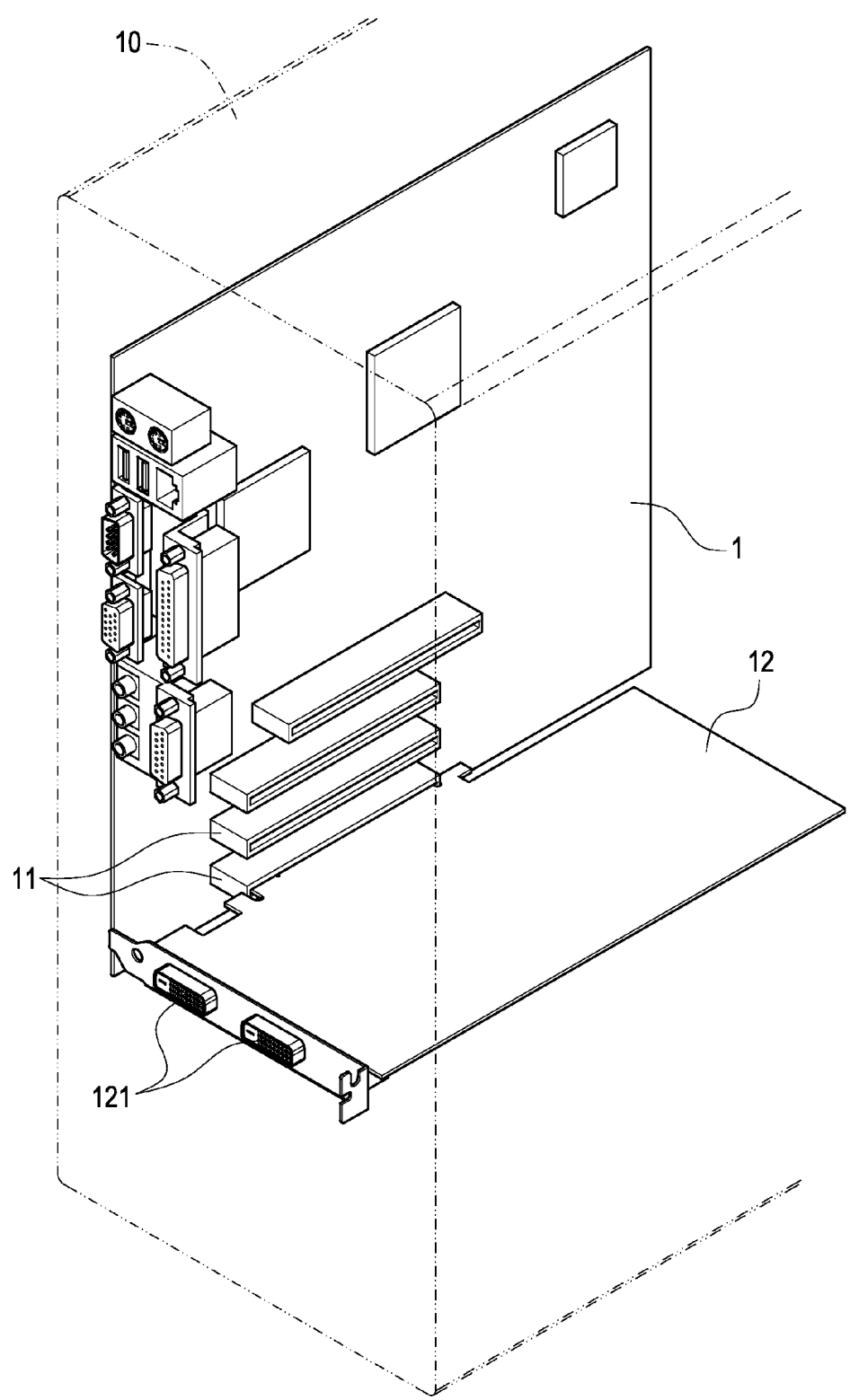
FIG. 1 is a schematic view showing connection of PCI-E interface card of Prior Art.
Figure 2A:
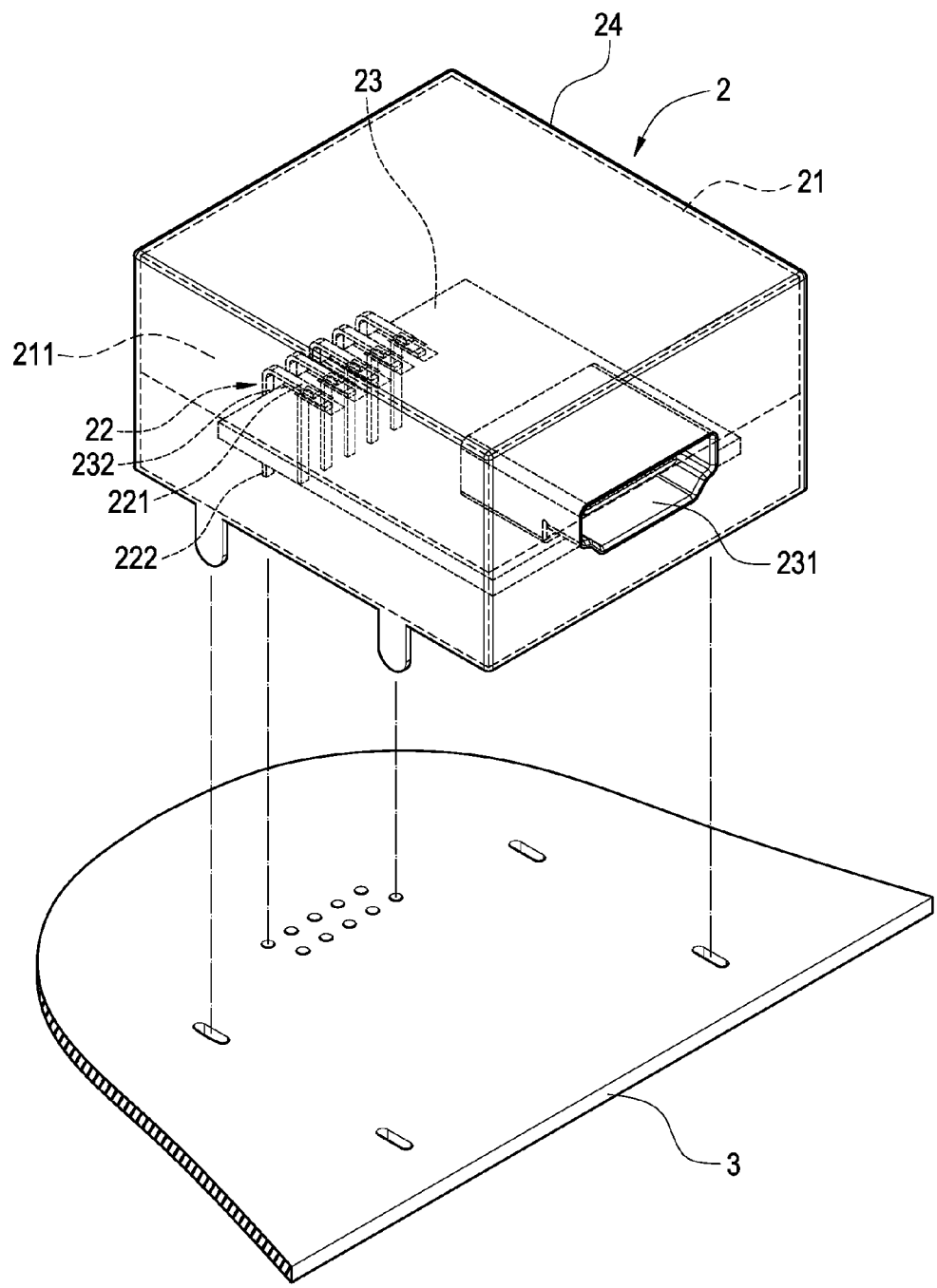
FIG. 2A is a perspective view showing a PCI-E module of a preferred embodiment of the present invention.

FIG. 2A is a perspective view showing a PCI-E module of a preferred embodiment of the present invention. The PCI-E module 2 of the present invention mainly includes an electrically-insulated housing 21, a plurality of connection terminals 22 and a circuit board 23. The housing 21 has an accommodating space 211 therein, the plurality of connection terminals 22 and the circuit board 23 are arranged in the accommodating space 211 of the housing 21.

The housing 21 is provided with an opening at one end thereof. The circuit board 23 has a port 231 arranged at one end and extending out of the housing 21 through the opening such that port 231 has physical connection with an external device (not shown).

Each of the plurality of connection terminals 22 has a connection end 221 and a welding end 222 away from the connection end 221. The circuit board 23 has a plurality of gold fingers 232 on both sides of the other end away from the port 231. The amount and the position of the gold fingers are corresponding to the connection ends 221 of the connection terminals 22, the plurality of gold fingers electrically connect with the connection ends 221 of the connection terminals 22.

As mentioned above, the circuit board 23 can be any kind of interface card complied with PCI-E interface, such as a display card showed in FIG. 2A. In this case, the port 231 on the circuit board 23 can be High Definition Multimedia Interface (HDMI) port.

Figure 2B:
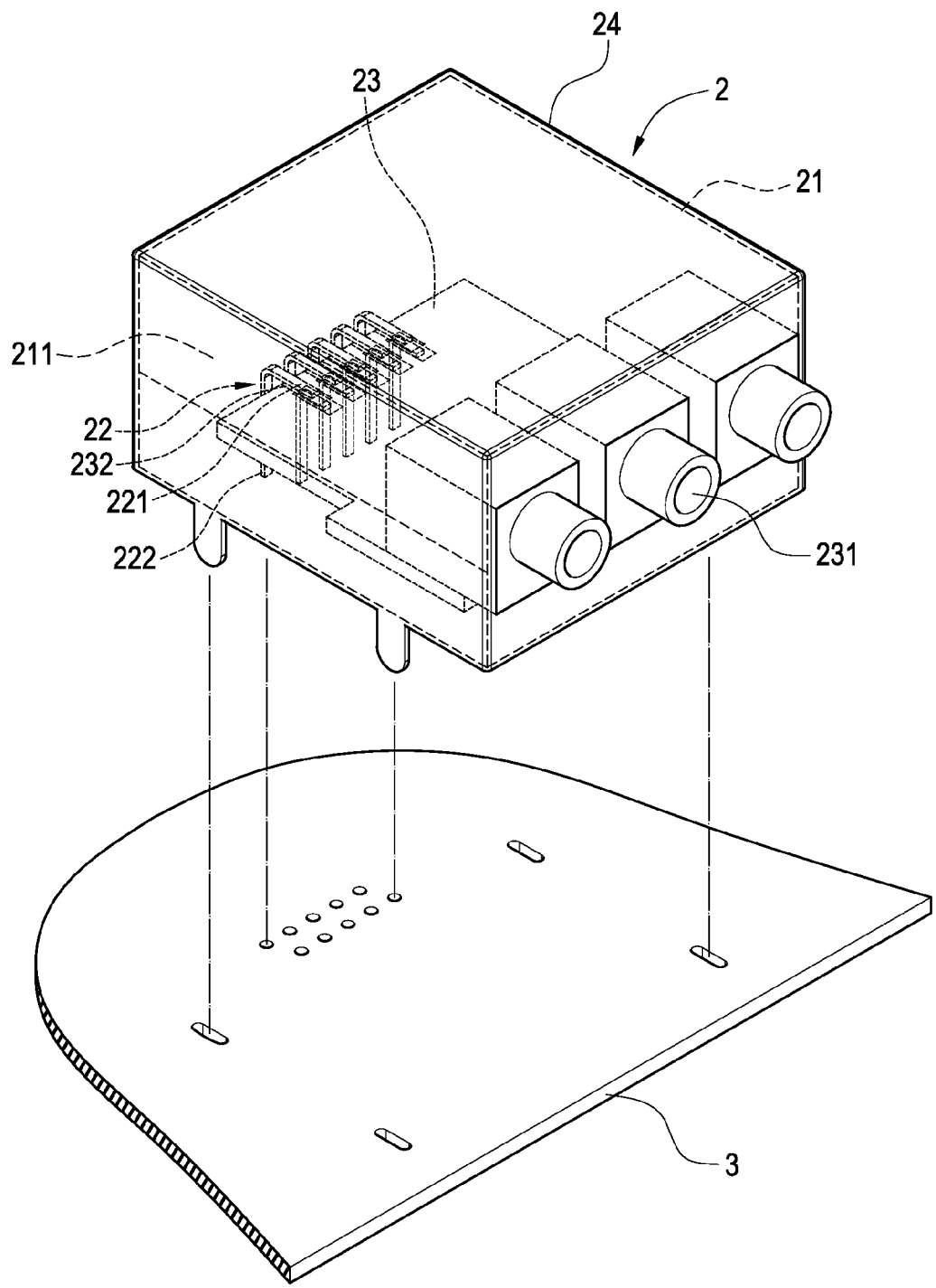
FIG. 2B is a perspective view showing the PCI-E module of a second embodiment of the present invention.

FIG. 2B is a perspective view showing the PCI-E module of a second embodiment of the present invention. In FIG. 2B, the circuit board 23 is shown as a sound card, and the port 231 on the circuit board 23 is shown as an audio input/output port, which for example is a microphone port or a speaker port.

Figure 2C:
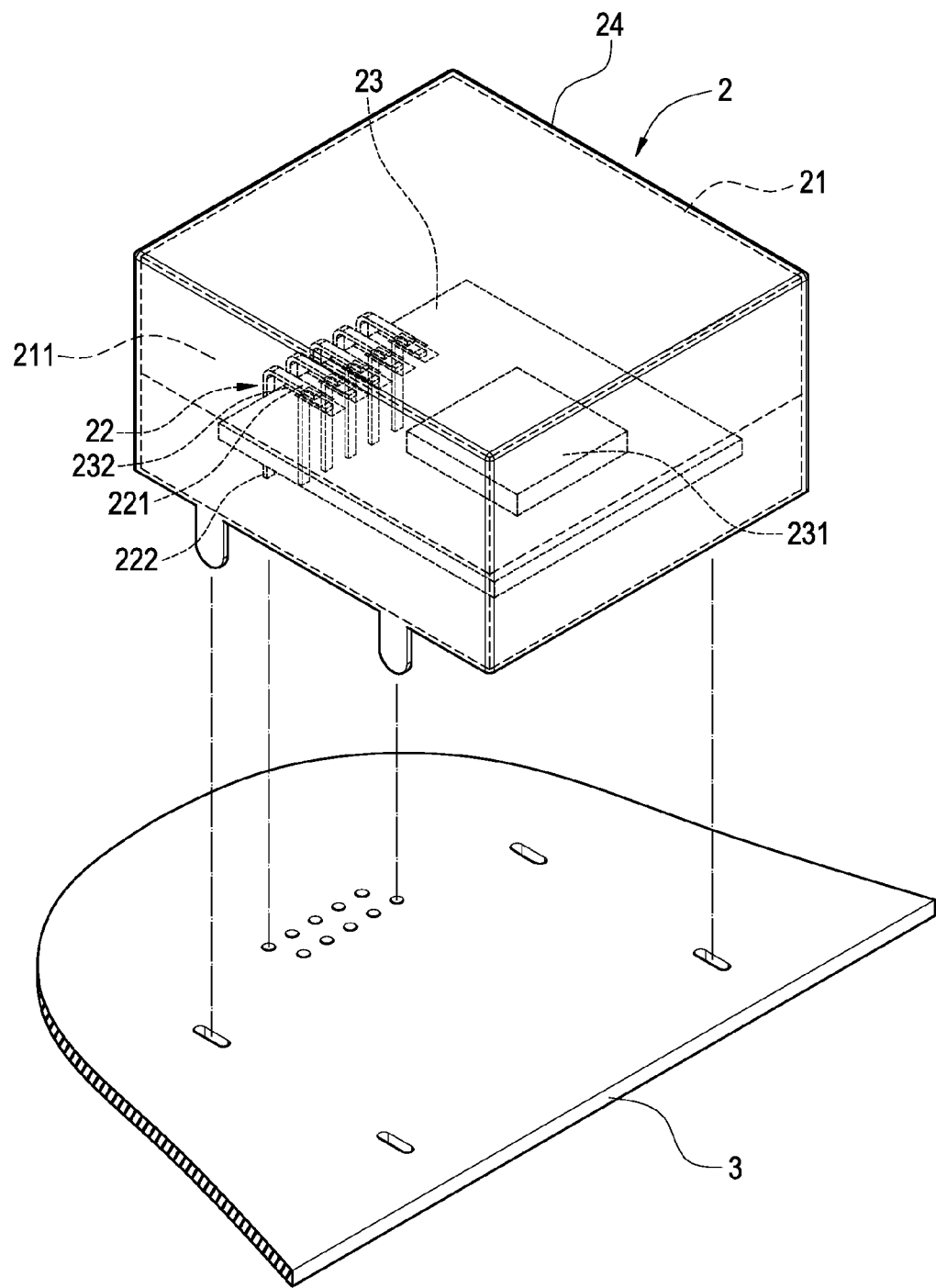
FIG. 2C is a perspective view showing the PCI-E module of a third embodiment of the present invention.

FIG. 2C is a perspective view showing the PCI-E module of a third embodiment of the present invention. In FIG. 2C, the circuit board 23 is shown as a wireless network card complied with PCI-E interface, and the port 231 on the circuit board 23 is shown as an antenna unit. The descriptions above are for preferred embodiments of the present invention, not intended to limit the protection scope of the present invention.

If the circuit board 23 is a display card as shown in FIG. 2A, then the port 231 also can be a VGA port or a D-sub port. Further, the circuit board 23 also can be a network card capable of connecting with an external cable line, and the port 231 can be, but not limited to, an RJ-45 port.

Figure 3:
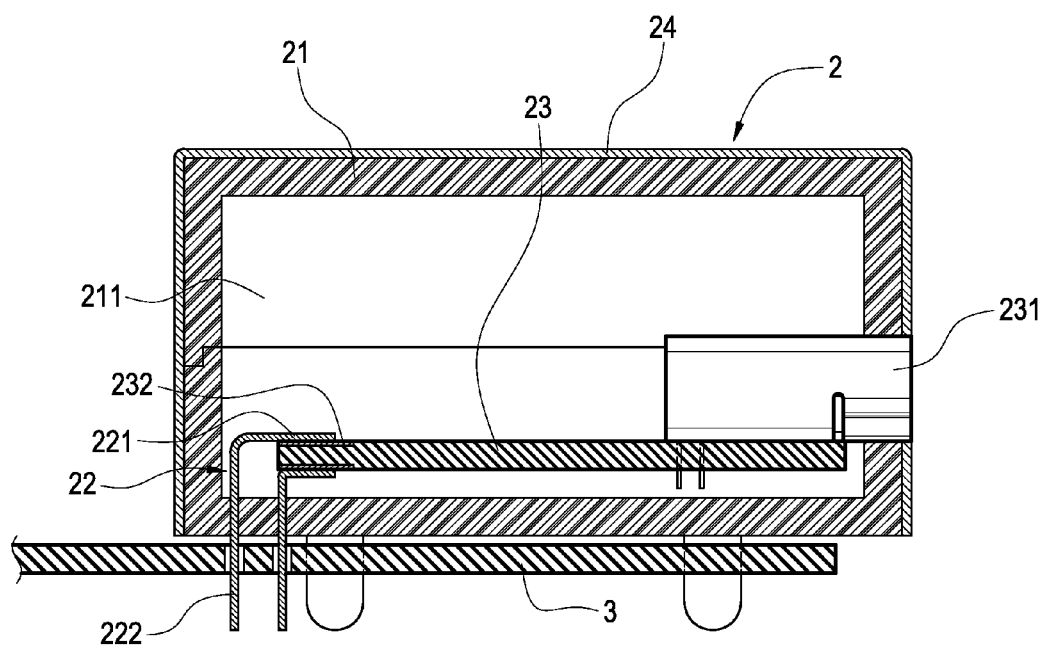
FIG. 3 is a sectional view showing the PCI-E module of a preferred embodiment of the present invention.

FIG. 3 is a sectional view showing the PCI-E module of a preferred embodiment of the present invention. Each welding end 222 of the connection terminals 22 is bent down through and extending out of the housing 21. The PCI-E module 2 can be welded directly on a main board 3 of a computer (not shown) through the welding ends 222 of the connection terminals 22.

The plurality of connection terminals 22 are arranged as in upper row and a lower row, respectively. The connection terminals of the upper row and the lower row are alternately (namely in staggered fashion) and parallelly configured in the accommodating space 211 (shown in FIG. 5). The connection ends 221 of the connection terminals of the upper row and the lower row are alternately connected to the plurality of gold fingers 232 on the both sides of the circuit board 23.

The PCI-E module 2 further includes a metal casing 24. The metal casing 24 encapsulates the housing 21 for providing the effect of metallic shield.

A grounding part of the plurality of gold fingers 232 on the circuit board 23 can be directly connected to the metal casing 24. In this case, the connection terminals 22 need not to provide the terminal which is responsible for grounding. However, the description is only for a preferred embodiment, not intended to limit the protection scope of the present invention.

Figure 4:
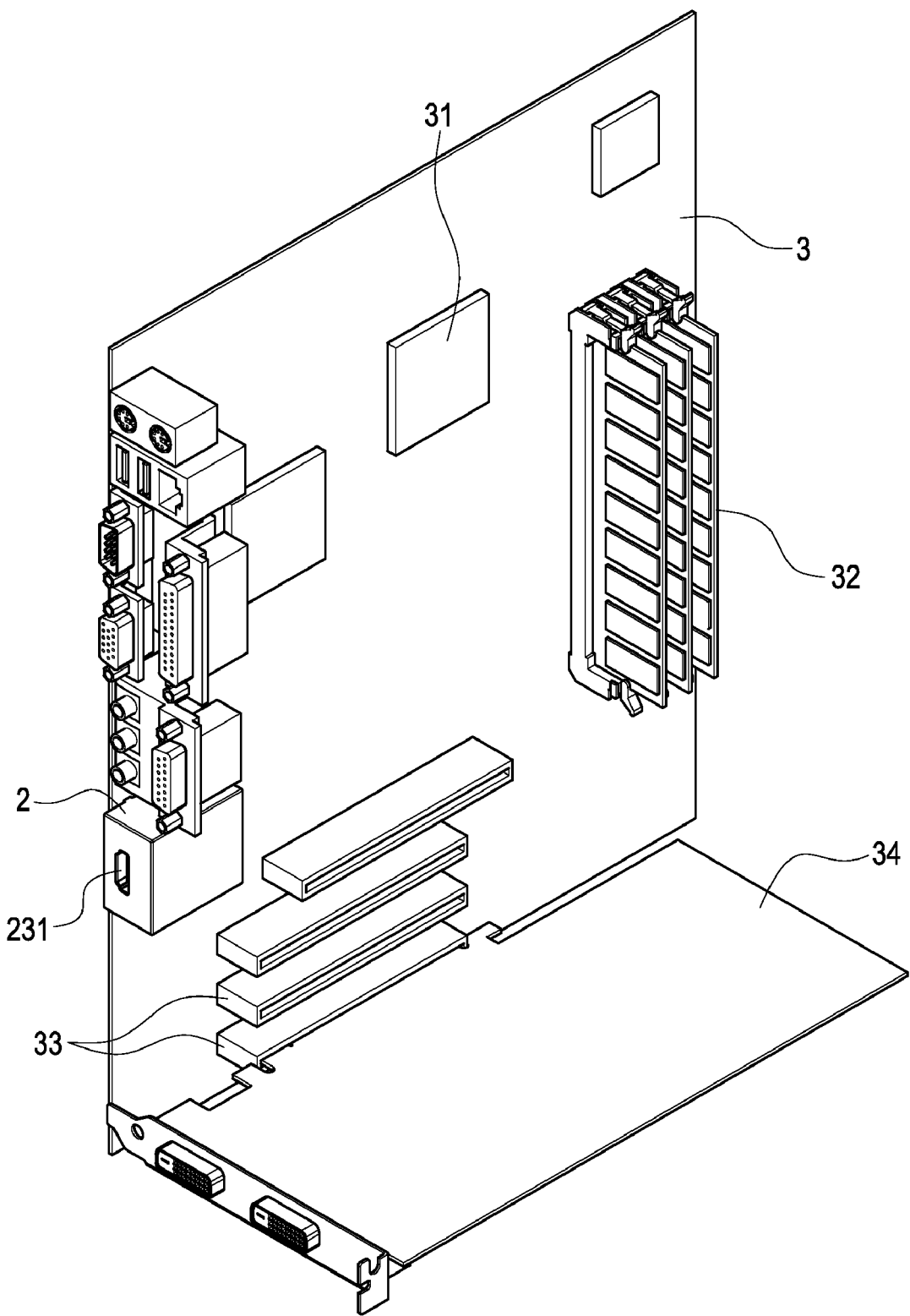
FIG. 4 is a schematic view showing connection of the PCI-E module of a preferred embodiment of the present invention.

FIG. 4 is a schematic view showing connection of the PCI-E module of a preferred embodiment of the present invention. The PCI-E module 2 is welded onto the main board 3, the main board 3 can further electrically connect with a central process unit (CPU) 31, a memory 32 and a PCI-E bus slot 33.

When the external device needs to connect with the main board 3, it can be a traditional way where an interface card 34 corresponding to the external device is plugged to the PCI-E bus slot 33, and then the external device connects to the interface card 34.

Furthermore, with the PCI-E module 2 in the present invention, the interface card 34 can be made as the circuit board 23, so that the circuit board 23 can be produced as the PCI-E module 2 for welding onto the main board 3. Thus, the external device connects to the main board 3 through the port 231 of the PCI-E module 2.

In this embodiment of the present invention, the amount of the plurality of connection terminals is at least ten. The plurality of connection terminals include two power terminals, one enable terminal (Enable), one grounding terminal (GND), one positive clock terminal (CLK+), one negative clock terminal (CLK−), one positive reception terminal (Rx+), one negative reception terminal (Rx−), one positive transmission terminal (Tx+) and one negative transmission terminal (Tx−).

The amount of the plurality of gold fingers 232 on the circuit board 23 is corresponding to the amount of the connection terminals 22. In this embodiment, the amount of the plurality of gold fingers 232 is also at least ten.

Figure 5:
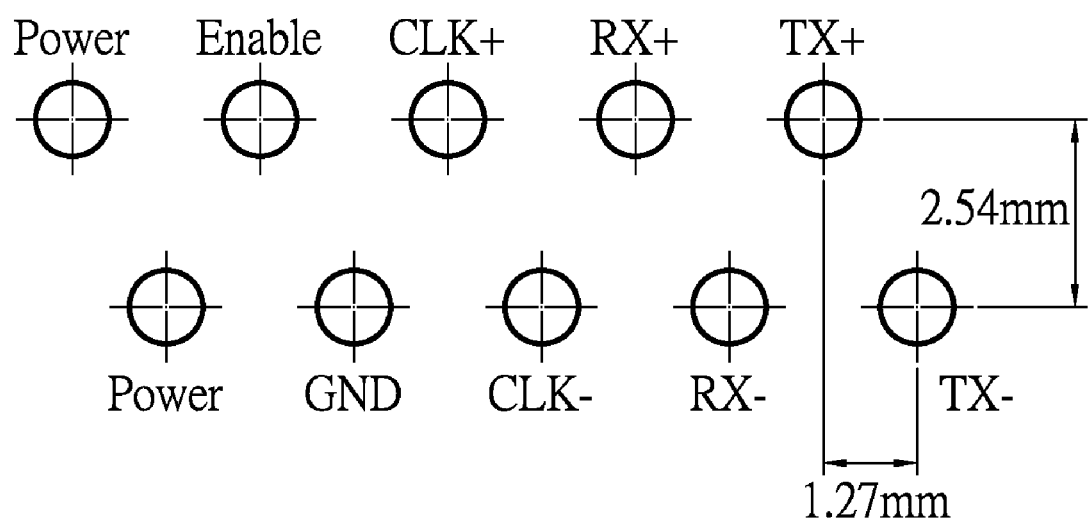
FIG. 5 is a schematic view showing arrangement state of connection terminals of a preferred embodiment of the present invention.

FIG. 5 is a schematic view showing arrangement of connection terminals of a preferred embodiment of the present invention. The plurality of connection terminals 22 are arranged in an upper row and a lower row, respectively. The connection terminals 22 of the upper row and the lower row are alternately and parallelly arranged in the accommodating space 211. Each connection end 221 of the connection terminals 22 of the upper row and the lower row is separately connected to the plurality of gold fingers 232 on the both sides of the circuit board 23.

Moreover, the arrangement for the connection terminals 22 of the upper row is according to the order of the power terminal, the enable terminal, the CLK+ terminal, the Rx+ terminal and the Tx+ terminal from the left to the right. The arrangement for the connection terminals 22 of the lower row is according to the order of the other power terminal, the GND terminal, the CLK− terminal, the Rx− terminal and the Tx− terminal from the left to the right.

Figure 6:
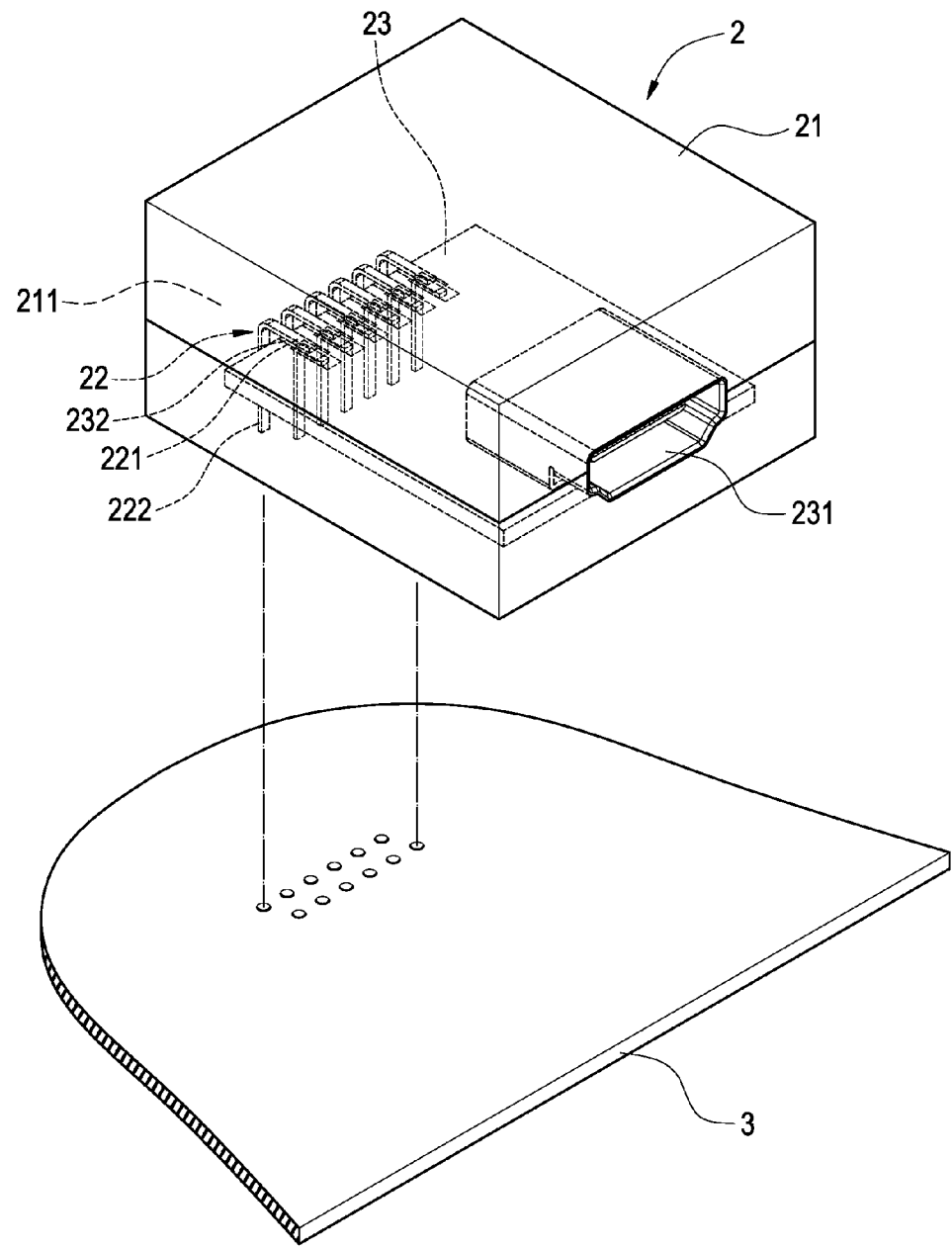
FIG. 6 is a perspective view showing the PCI-E module of a fourth embodiment of the present invention.

FIG. 6 is a perspective view showing the PCI-E module of a fourth embodiment of the present invention. If the PCI-E module 2 does not have the metal casing 24 as shown in FIG. 3, the plurality of connection terminals 22 should further include two GND terminals for connecting with the grounding part of the plurality of gold fingers 232 on the circuit board 23.

In this embodiment, the amount of the plurality of connection terminals 22 is twelve. The connection terminals 22 include two power terminals, one enable terminal, three GND terminals, one CLK+ terminal, one CLK− terminal, one Rx+ terminal, one Rx− terminal, one Tx+ terminal and one Tx− terminal. The amount of the plurality of gold fingers 232 on the circuit board 23 is corresponding to the amount of the connection terminals 22. In this embodiment, the amount of the plurality of gold fingers 232 is twelve.

Figure 7:
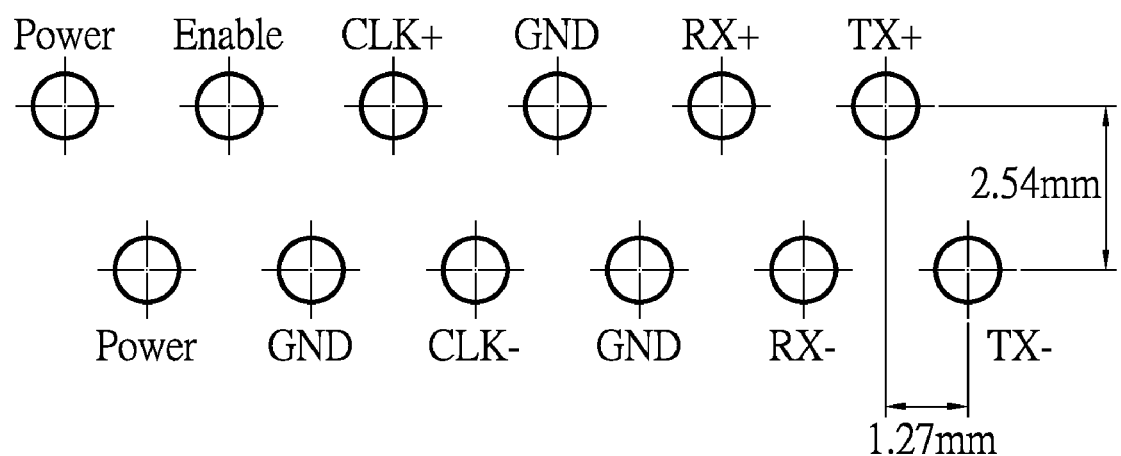
FIG. 7 is a schematic view showing arrangement state of connection terminals of the fourth embodiment of the present invention.

FIG. 7 is a schematic view showing arrangement of connection terminals of the fourth embodiment of the present invention. The amount of the connection terminals 22 is twelve, and the connection terminals 22 are arranged in an upper row and a lower row, respectively. The connection terminals 22 of the upper row and the lower row are alternately and parallelly arranged in the accommodating space 211. Each connection ends 221 of the connection terminals 22 of the upper row and the lower row is separately connected to the plurality of gold fingers 232 on the both sides of the circuit board 23.

The arrangement for the connection terminals 22 of the upper row is according to the order of the power terminal, the enable terminal, the CLK+ terminal, the GND terminal, the Rx+ terminal and the Tx+ terminal from the left to the right. The arrangement for the connection terminals 22 of the lower row is according to the order of the other power terminal, the other GND terminal, the CLK− terminal, another GND terminal, the Rx− terminal and the Tx− terminal from the left to the right.

More particularly, the height between the connection terminals 22 of the upper row and the lower row is 2.54 mm, the width between the connection terminals 22 of the upper row and the lower row is 1.27 mm, and the width between the adjacent connection terminals 22 of same row is 2.54 mm, but the above dimensions are not intended to limit the protection scope of the present invention.

Although the present invention has been described with reference to the foregoing preferred embodiments, it will be understood that the invention is not limited to the description thereof. Any equivalent variations and modifications can be made to those skilled in the art in view of the teaching of the present invention are also in the scope of the invention as defined in the appended claims.

What is claimed is:

1. A PCI-E module for directly welding on a main board of a computer, comprising:
   an electrically-insulated housing having an accommodating space;
   a plurality of connection terminals alternately and parallelly arranged in the accommodating space, and each of the plurality of connection terminals having a connection end and a welding end away from the connection end; and
   a circuit board functioning as an interface card of an external device and arranged in the accommodating space, the circuit board having a port at one end, and having a plurality of gold fingers on both sides of the other end away from the port, wherein the amount and the position of the plurality of gold fingers are corresponding to the plurality of connection terminals;
   wherein the plurality of gold fingers are electrically connected with the plurality of connection terminals, and each welding end of the connection terminals is bent down through and extends out of the electrically-insulated housing for directly welding the PCI-E module onto the main board through the welding ends,
   wherein the amount of the plurality of connection terminals and the plurality of gold fingers is at least ten,
   wherein the plurality of connection terminals include two power terminals (Power), one enable terminal (Enable), one grounding terminal (GND), one positive clock terminal (CLK+), one negative clock terminal (CLK−), one positive reception terminal (Rx+), one negative reception terminal (Rx−), one positive transmission terminal (Tx+) and one negative transmission terminal (Tx−), and
   wherein the plurality of connection terminals are arranged in an upper row and a lower row in the accommodating space, and wherein the arrangement for the connection terminals of the upper row is according to the order of the power terminal, the enable terminal, the CLK+ terminal, the Rx+ terminal and the Tx+ terminal from the left to the right, and the arrangement for the connection terminals of the lower row is according to the order of the other power terminal, the GND terminal, the CLK-terminal, the Rx-terminal and the Tx-terminal from the left to the right.

2. The PCI-E module according to claim 1, wherein the height between the connection terminals of the upper row and the lower row is 2.54 mm, and wherein the width between the connection terminals of the upper row and the lower row is 1.27 mm, and the width between the adjacent connection terminals of same row is 2.54 mm.

3. The PCI-E module according to claim 1, wherein the circuit board is a display card.

4. The PCI-E module according to claim 1, wherein the circuit board is a sound card.

5. The PCI-E module according to claim 1, wherein the circuit board is a network card.

6. The PCI-E module according to claim 1, wherein the circuit board is a wireless network card.

7. The PCI-E module according to claim 3, wherein the port on the circuit board is a high definition multimedia interface (HDMI) port.

8. The PCI-E module according to claim 3, wherein the port on the circuit board is a digital visual interface (DVI) port.

9. The PCI-E module according to claim 3, wherein the port on the circuit board is a D-sub port.

10. The PCI-E module according to claim 4, wherein the port on the circuit board is an audio input/output port.

11. The PCI-E module according to claim 5, wherein the port on the circuit board is an RJ-45 port.

12. The PCI-E module according to claim 6, wherein the port on the circuit board is an antenna unit.

13. A PCI-E module for directly welding on a main board of a computer, comprising:
   an electrically-insulated housing having an accommodating space;
   a plurality of connection terminals alternately and parallelly arranged in the accommodating space, and each of the plurality of connection terminals having a connection end and a welding end away from the connection end; and
   a circuit board functioning as an interface card of an external device and arranged in the accommodating space, the circuit board having a port at one end, and having a plurality of gold fingers on both sides of the other end away from the port, wherein the amount and the position of the plurality of gold fingers are corresponding to the plurality of connection terminals;
   wherein the plurality of gold fingers are electrically connected with the plurality of connection terminals, and each welding end of the connection terminals is bent down through and extends out of the electrically-insulated housing for directly welding the PCI-E module onto the main board through the welding ends,
   wherein the amount of the plurality of connection terminals and the plurality of gold fingers is twelve,
   wherein the plurality of connection terminals include two power terminals (Power), one enable terminal (Enable), three grounding terminals (GND), one positive clock terminal (CLK+), one negative clock terminal (CLK−), one positive reception terminal (Rx+), one negative reception terminal (Rx−), one positive transmission terminal (Tx+) and one negative transmission terminal (Tx−),
   wherein the plurality of connection terminals are arranged in an upper row and a lower row in the accommodating space, and wherein the arrangement for the connection terminals of the upper row is according to the order of the power terminal, the enable terminal, the GND terminal, the CLK+ terminal, the Rx+ terminal and the Tx+ terminal from the left to the right, and the arrangement for the connection terminals of the lower row is according to the order of the other power terminal, the other GND terminal, the CLK− terminal, another GND terminal, the Rx− terminal and the Tx− terminal from the left to the right.

14. The PCI-E module according to claim 13, wherein the height between the connection terminals of the upper row and the lower row is 2.54 mm, and wherein the width between the connection terminals of the upper row and the lower row is 1.27 mm, and the width between the adjacent connection terminals of same row is 2.54 mm.

* * * * *